United States Patent
Suzaki et al.

(10) Patent No.: US 11,415,882 B2
(45) Date of Patent: Aug. 16, 2022

(54) TEMPLATE FOR IMPRINT AND IMPRINT METHOD USING TEMPLATE

(71) Applicant: CANON KABUSHIKI KAISHA, Tokyo (JP)

(72) Inventors: Yoshio Suzaki, Tochigi (JP); Tomomi Funayoshi, Tochigi (JP); Toshihiko Nishida, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/110,089

(22) Filed: Dec. 2, 2020

(65) Prior Publication Data

US 2021/0173302 A1 Jun. 10, 2021

(30) Foreign Application Priority Data

Dec. 5, 2019 (JP) .............................. JP2019-220762

(51) Int. Cl.
*G03F 7/00* (2006.01)
*B29C 33/42* (2006.01)

(52) U.S. Cl.
CPC .......... *G03F 7/0002* (2013.01); *B29C 33/424* (2013.01); *B29C 2033/426* (2013.01)

(58) Field of Classification Search
CPC ............. B29C 33/424; B29C 2033/426; G03F 7/0002
See application file for complete search history.

(56) References Cited

U.S. PATENT DOCUMENTS

| | | | |
|---|---|---|---|
| 2009/0224436 A1* | 9/2009 | Mikami | B82Y 10/00 264/447 |
| 2010/0189839 A1* | 7/2010 | Sano | B29C 35/0894 425/174.4 |
| 2015/0221501 A1* | 8/2015 | Tsuji | G03F 7/0002 264/447 |
| 2019/0086798 A1* | 3/2019 | Nagai | B29C 33/38 |

FOREIGN PATENT DOCUMENTS

| | | |
|---|---|---|
| JP | 2009-212449 A | 9/2009 |
| JP | 2015-144193 A | 8/2015 |

* cited by examiner

*Primary Examiner* — Jerzi H Moreno Hernandez
(74) *Attorney, Agent, or Firm* — Canon U.S.A., Inc., IP Division

(57) ABSTRACT

A template for imprint comprises a main body having a bottom surface, a middle surface on a portion protruding relative to the bottom surface, and a pattern surface on a portion protruding relative to the middle surface, the pattern surface having an uneven pattern, wherein an outer edge of the pattern surface has a jigsaw shape, wherein a light-shielding member having a light transmittance lower than a light transmittance of the main body is disposed on the middle surface to surround the outer edge of the pattern surface in a plan view as viewed from the pattern surface, and wherein an outer edge of light-shielding member defines four sides having a shape in which a center of each side bulges outward with respect to a rectangle surrounding the outer edge of the pattern surface in the plan view, and wherein the shape of each side bulges outwardly in a stepwise manner from the ends of each side to the center of each side.

4 Claims, 8 Drawing Sheets

TEMPLATE FOR IMPRINT AND IMPRINT METHOD USING TEMPLATE

BACKGROUND OF THE INVENTION

Field of the Invention

The present disclosure relates to a template for imprint and an imprint method using a template.

Description of the Related Art

As one of techniques for forming an element pattern of a semiconductor device, there is an imprint technique.

Conventionally, there has been known an imprint method of forming a cured material having an uneven pattern on a substrate by irradiating a photocurable material with light in a state where an uneven pattern formed on a template and the photocurable material disposed on the substrate are in contact with each other.

Further, as an example of the imprint method, there is known an imprint method of forming a pattern in each of a plurality of shot regions of a substrate sequentially by repeating molding operation.

In such an imprint method, if a photocurable material protruding from an edge of a template is irradiated with light when a certain shot region is molded, the irradiated photocurable material can adhere to a side surface of the template as a cured material. The material having adhered can disadvantageously act in an imprint process for a subsequent shot region or a device manufacturing process.

Japanese Patent Laid-Open No. 2009-212449 discusses a template having a top surface (a surface opposite to a pattern surface) on which a light-shielding film is disposed. According to the document, a photocurable resin in a pattern outer-peripheral region, which is outside a pattern formation region, is not completely cured to prevent a descent of the template from being hindered due to presence of an adjacent shot region.

In recent years, there has been also discussed an imprint method of forming a pattern in each of a plurality of shot regions of a substrate sequentially using a template having a pattern surface whose outer edge has a jigsaw shape. This can reduce the width of a scribe line (a region where an alignment mark is formed) and thus increase yield in comparison with a pattern surface whose outer edge has a rectangular shape.

However, if a light-shielding member having a uniform width is simply disposed along the edge of such a template, there is a possibility that an irradiation region (which is typically rectangular) that is irradiated by an illumination system of an imprint apparatus cannot be appropriately shielded.

SUMMARY OF THE INVENTION

The present disclosure is directed to a template that has a pattern surface whose outer edge has a jigsaw shape and is advantageous to reduce adhesion of a cured material to a side surface of the template.

The present disclosure in its one aspect provides a template for imprint, the template comprising a main body having a bottom surface, a middle surface on a portion protruding relative to the bottom surface, and a pattern surface on a portion protruding relative to the middle surface, the pattern surface having an uneven pattern, wherein an outer edge of the pattern surface has a jigsaw shape, wherein a light-shielding member having a light transmittance lower than a light transmittance of the main body is disposed on the middle surface to surround the outer edge of the pattern surface in a plan view as viewed from the pattern surface, and wherein the light-shielding member is disposed at least in an entire region within a depressed portion of an outer edge of the jigsaw shape.

Further features of the present disclosure will become apparent from the following description of exemplary embodiments with reference to the attached drawings.

DESCRIPTION OF THE EMBODIMENTS

An exemplary embodiment of the present disclosure will be described below with reference to the drawings.

Figure 1:
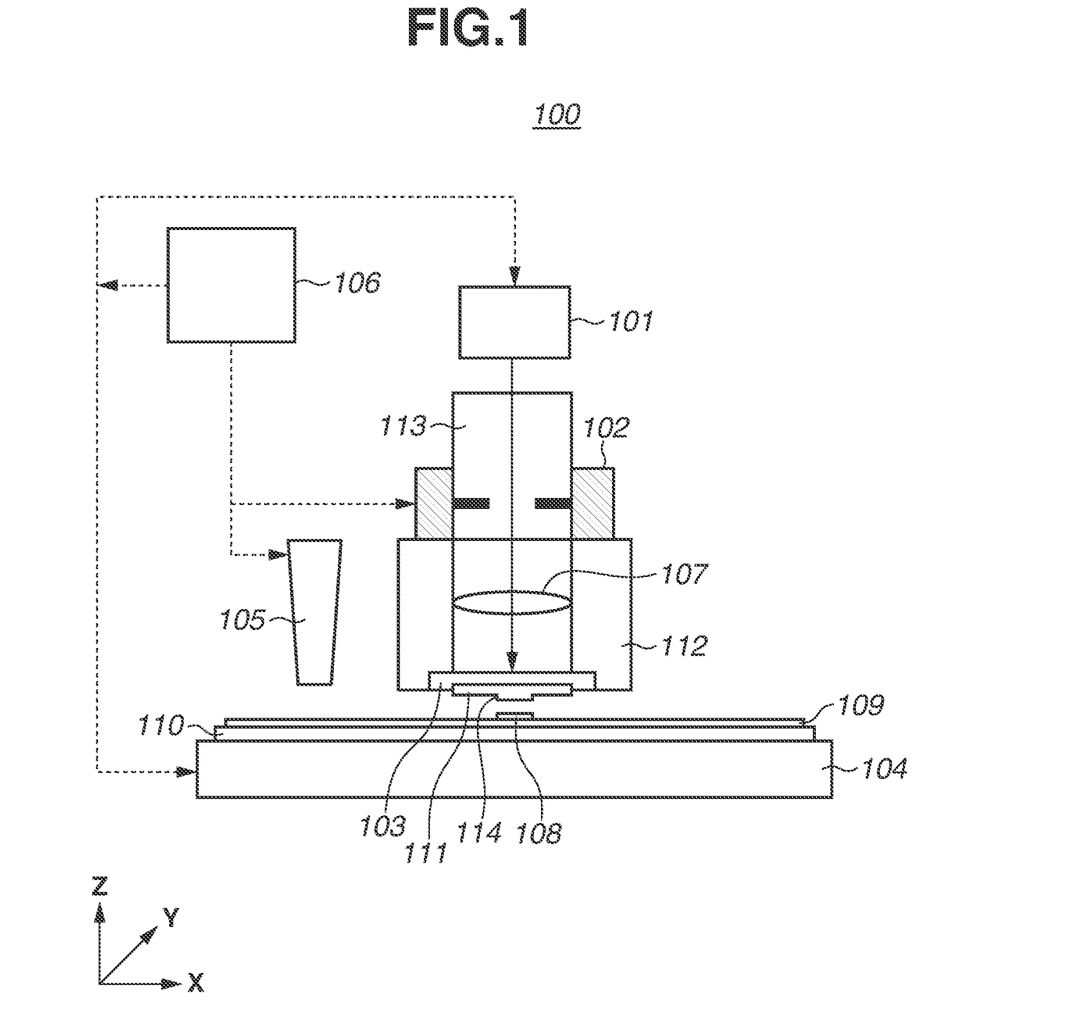
FIG. 1 is a schematic view of an imprint apparatus.

FIG. 1 illustrates an imprint apparatus 100 according to the present exemplary embodiment. In FIG. 1, a Z-axis direction represents a vertical direction, and an X-direction and a Y-direction that are orthogonal to the Z-axis represent a horizontal direction. The imprint apparatus 100 forms a cured material having an uneven pattern on a substrate 109 by irradiating an imprint material 108 with light in a state where an uneven pattern formed in a template (mold) and the imprint material 108 that is photocurable on the substrate 109 are in contact with each other. In the present exemplary embodiment, the imprint apparatus 100 that cures the imprint material 108 by irradiation with light (ultraviolet light) having wavelengths of 200 nm to 380 nm will be described as an example, but the present exemplary embodiment is not limited to the example.

A base material of the substrate 109 is a silicon wafer, has a circular shape, and is 300 mm in diameter. However, the material and size thereof are not limited thereto. Applicable examples of the base material include known base materials such as aluminum, a titanium-tungsten alloy, an aluminum-silicon alloy, an aluminum-copper-silicon alloy, silicon oxide, sapphire, and silicon nitride. The substrate 109 may be a substrate in which a device layer and an adhesion layer are formed on a base material.

In the present exemplary embodiment, an ultraviolet curable resin is used as the imprint material 108. The ultraviolet curable resin may be a monomer such as acrylate or methacrylate. The imprint material may include one of a polymerizable compound, a photopolymerization initiator, a non-polymerizable compound, and a solvent, and may include at least one of a sensitizer, a hydrogen donor, an internal mold release agent, a surfactant, an antioxidant, and a polymer component as the non-polymerizable compound. The imprint material 108 according to the present exemplary embodiment is cured by irradiation with light (ultraviolet light) having wavelengths of 200 nm to 380 nm.

The imprint apparatus 100 illustrated in FIG. 1 includes a light source 101, and the light source 101 emits light 113 that cures the imprint material 108 applied to the substrate 109. The imprint apparatus 100 may further include an optical system 107 including a lens and a mirror to guide the light 113 from the light source 101. The optical system 107 may be used to achieve uniform light intensity. The imprint apparatus 100 further includes a light-shielding mechanism 102 for controlling the shape of a light beam from the light source 101. The light-shielding mechanism 102 includes a light-shielding plate and a driving mechanism for driving the light-shielding plate. As the driving mechanism, for example, a motor is used, but the driving mechanism is not limited to the motor. Typically, the light-shielding plate consists of a pair of light-shielding plates each having an edge parallel with the X-direction, and a pair of light-shielding plates each having an edge parallel with the Y-direction, and the light-shielding plate forms a rectangular opening of a predetermined size by controlling driving of the light-shielding plates.

A stage 104 supports a chuck 110 (substrate chuck) for holding the substrate 109. A support 112 supports a chuck 103 (mold chuck) for holding a template 111. The imprint apparatus 100 further includes a plurality of actuators (not illustrated) for driving the chuck 103. The chuck 103 is driven in the vertical direction and a tilt direction by the plurality of actuators. A pattern surface (a surface where an uneven pattern is formed) of a mesa portion 114 of the template 111 is brought into contact with the imprint material 108 applied to the substrate 109, and the light source 101 irradiates the imprint material 108 with light in this state, so that the imprint material 108 is cured. When the template 111 is moved upward after curing, a cured material having a surface shape corresponding to the contact surface of the template 111 is formed on the substrate 109. Thus, the imprint apparatus 100 forms a pattern on the substrate 109.

The stage 104 can move in the X-direction and the Y-direction over a base (not illustrated) in a state where the substrate 109 is held by the chuck 110. When the substrate 109 is brought on the chuck 110 or removed from the chuck 110, the stage 104 is moved to a position away from underneath the chuck 103. Further, the stage 104 is repeatedly moved to form the pattern in a plurality of shot regions of the substrate 109 sequentially.

As a drive unit for driving the stage 104, a linear motor is used in the present exemplary embodiment. However, the drive unit is not limited thereto, and a conventional technique such as a driving mechanism in which a ball screw and a rotary motor are combined can be applied. In the present exemplary embodiment, the stage 104 moves in directions along two axes, i.e., the X-direction and the Y-direction, but may move in directions along six axes. The stage 104 includes a top panel, and may further include a tabular member connected to the top panel.

The chuck 110 is fixed to the stage 104 by fastening or adsorption. The chuck 110 has a holding surface for holding the substrate 109. As a method of holding the substrate 109 by the chuck 110, a conventional technique such as a vacuum suction method or an electrostatic adsorption method can be applied. In the case of the vacuum suction method, a recessed portion (groove) formed on the surface of the chuck 110 and a negative pressure generating device are communicated. The chuck 110 can hold the substrate 109 by forming a negative pressure in the inside of the recessed portion in a state where the substrate 109 is mounted on the holding surface.

The chuck 103 has a holding surface for holding the template 111. As a method of holding the template 111 on the chuck 103, the conventional technique such as the vacuum suction method or the electrostatic adsorption method can be applied. In the case of the vacuum suction method, a recessed portion (groove) formed on the surface of the chuck 103 and a negative pressure generating device are communicated. The chuck 103 can hold the template 111 by forming a negative pressure in the inside of the recessed portion in a state where the template 111 is mounted on the holding surface.

A dispenser 105 includes a nozzle (discharging unit) that discharges a droplet of the imprint material 108 onto the substrate 109. As a discharge method, a piezoelectric jet method or a micro solenoid method can be used. The number of nozzles is not particularly limited, and the dispenser 105 can include one nozzle array or a plurality of nozzle arrays.

The imprint apparatus 100 includes a conveyance hand for conveying a substrate. The imprint apparatus 100 may further include a scope for detecting a relative position between a mark formed on the template 111 and a mark formed on the substrate 109. The imprint apparatus 100 may further include a camera for observing a state of the contact between the template 111 and the imprint material 108.

The dispenser 105 and the support 112 are supported by a main body (not illustrated). The main body may further support the above-described scope and camera.

A control unit 106 includes a processor such as a central processing unit (CPU), a storage unit such as a random access memory (RAM), a read only memory (ROM), or a hard disk drive (HDD), and an interface unit for connecting the processor with an external device. The interface unit includes a communication interface for communicating with a host computer. The host computer is, for example, a computer for controlling an entire factory or an area of the factory where the imprint apparatus 100 is disposed. The processor controls an operation of the imprint apparatus 100 by executing a program stored in the storage unit. The control unit 106 may include a plurality of circuit boards. Further, the whole or a part of the control unit 106 may be disposed on a rack inside a chamber (housing) of the imprint apparatus 100, or may be disposed outside the chamber.

The control unit 106 controls the operation of the imprint apparatus 100. Here, the operation of the imprint apparatus 100 includes an operation of each unit. The control unit 106 controls the irradiation of the imprint material 108 with light and an operation of the stage 104.

Figure 2:
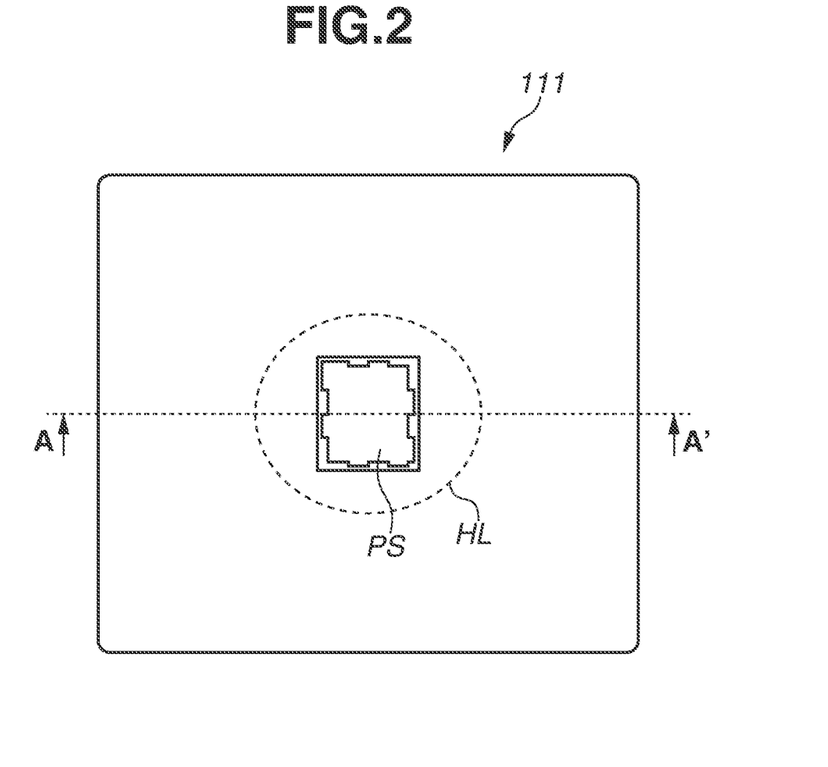
FIG. 2 is a bottom view of a mold (template).
Figure 3:
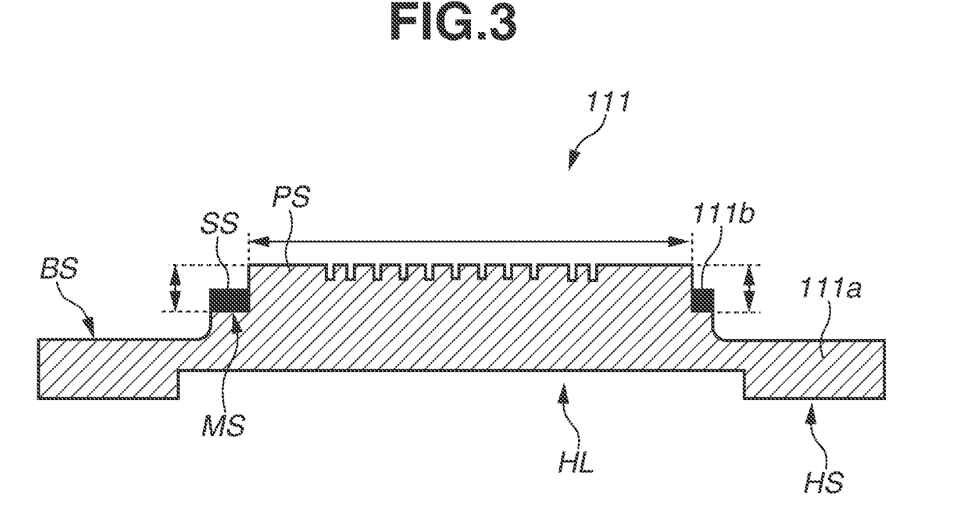
FIG. 3 is an A-A' cross-sectional view of the mold in FIG. 2.

FIG. 2 is a bottom view of the template 111 according to the present exemplary embodiment (as viewed from the substrate 109 in a state where the template 111 is held by the chuck 103), and FIG. 3 is an A-A' cross-sectional view of the template 111 in FIG. 2.

A main body 111a of the template 111 has a bottom surface BS, a middle surface MS of a portion protruding relative to the bottom surface BS, and a pattern surface PS of a portion protruding relative to the middle surface MS. The uneven pattern is formed on the pattern surface PS. The pattern surface PS, the bottom surface BS, and the middle surface MS all vary in height and are all on the same side (the upper side in FIG. 3). In other words, steps are formed in the main body 111a to have surfaces varying in height. The bottom surface BS is at a position further away from the pattern surface PS than the middle surface MS (i.e., a position close to a held surface HS of the template (mold) 111).

The template 111 is made of a material that enables ultraviolet light to pass therethrough. In the present exemplary embodiment, quartz is used, but the material of the template 111 is not limited thereto. Another material such as glass, polymethyl methacrylate (PMMA), or polycarbonate resin may be used as the material of the template 111.

A light-shielding member 111*b* is formed on the middle surface MS. A material of the light-shielding member 111*b* is, for example, chromium (Cr), but is not limited thereto. The ultraviolet transmittance of the light-shielding member 111*b* is smaller than the ultraviolet transmittance of the main body 111*a*. Preferably, the ultraviolet transmittance of the light-shielding member 111*b* is 50% or less, more preferably, 30% or less or 10% or less, of the ultraviolet transmittance of the main body 111*a*.

A distance between the pattern surface PS and the bottom surface BS is greater than the depth (or height) of the uneven pattern. The thickness of the light-shielding member 111*b* is smaller than a distance between the pattern surface PS and the middle surface MS. In other words, a surface (surface SS) of the light-shielding member 111*b* is at a height between the pattern surface PS and the middle surface MS. Preferably, a distance between the pattern surface PS and the bottom surface BS is greater than the depth of the uneven pattern, the thickness of the light-shielding member 111*b* is greater than the depth of the uneven pattern, and a distance between the pattern surface PS and the surface SS of the light-shielding member 111*b* is greater than the depth of the uneven pattern. For example, the depth (or height) of the uneven pattern may be 30 nm to 100 nm, the distance between the pattern surface PS and the bottom surface BS may be 200 nm to 800 nm, and the thickness of the light-shielding member 111*b* may be 100 nm to 300 nm.

The main body 111*a* of the template 111 has the held surface HS. A recess HL is formed on an opposite side of the pattern surface PS of the template 111. Gas can be supplied to and discharged from the recess HL by the imprint apparatus 100 in a state where the template 111 is held by the chuck 103, so that the curved shape of the template 111 can be controlled during imprint. For example, the pattern surface PS can have a shape protruding toward the substrate 109, so that gas trapping can be reduced when the template 111 and the imprint material 108 on the substrate 109 are brought into contact with each other.

A broken line in FIG. 2 indicates the outline of the recess HL, and the outline is preferably circular, but is not limited thereto.

Figure 4:
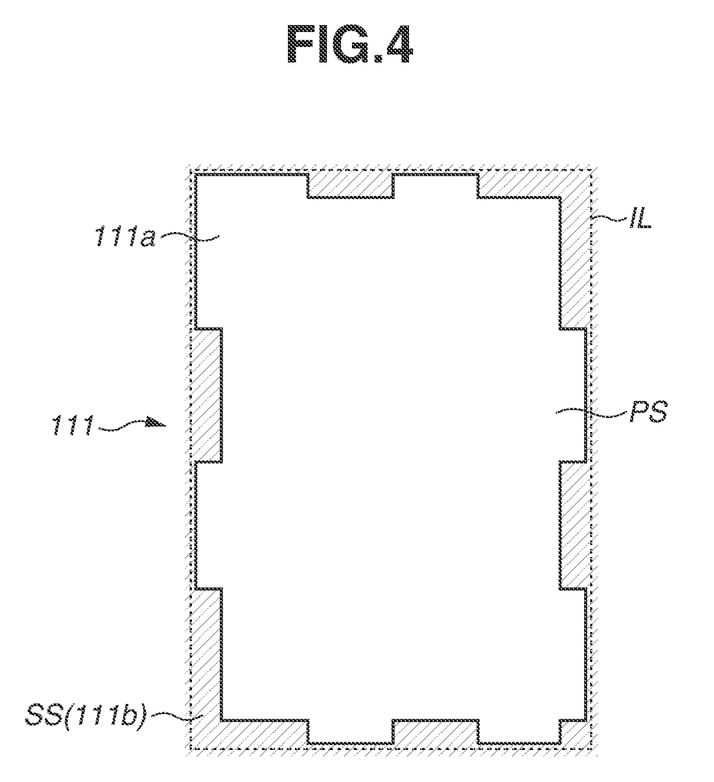
FIG. 4 is a diagram illustrating details of a pattern surface PS of the mold in FIG. 2 and a light-shielding surface SS.

FIG. 4 is a view (plan view) illustrating the template 111 as viewed from above in FIG. 3 and illustrating the outer edge of each of the pattern surface PS and the surface SS (shaded area) of the light-shielding member 111*b*.

Figure 8:
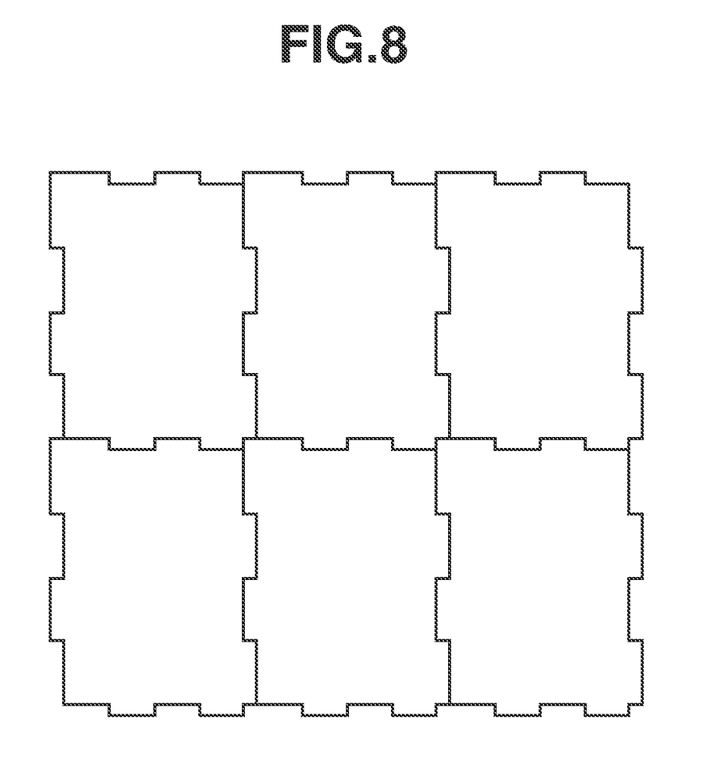
FIG. 8 is a diagram illustrating a plurality of shot regions each having a jigsaw shape.

The outer edge of the pattern surface PS has a jigsaw shape. The pattern is formed in the plurality of shot regions of the substrate 109 sequentially, as illustrated in FIG. 8. Because the outer edge of the pattern surface PS has such a jigsaw shape, the width of a scribe line (a region where an alignment mark is formed) can be reduced and thus yield can be increased in comparison with a pattern surface whose outer edge has a rectangular shape. The jigsaw shape refers to a shape having a projected portion and a depressed portion on each side, but is not limited to the shape illustrated in FIG. 4.

As described above, the light-shielding member 111*b* having the light (ultraviolet light) transmittance lower than that of the main body 111*a* is disposed on the middle surface MS to surround the outer edge of the pattern surface PS in a plan view as viewed from the pattern surface PS. The light-shielding member 111*b* is disposed (formed) at least in an entire region within the depressed portion of the outer edge of the jigsaw shape. The width of the light-shielding member 111*b* is not uniform, and the width of a portion adjacent to the projected portion of the jigsaw shape is, for example, half or less the width of a portion adjacent to the depressed portion.

In FIG. 4, a region within an irradiation region IL is to be irradiated with the light. The irradiation region IL has a rectangular shape corresponding to the opening of the light-shielding plate of the light-shielding mechanism 102.

Figure 5:
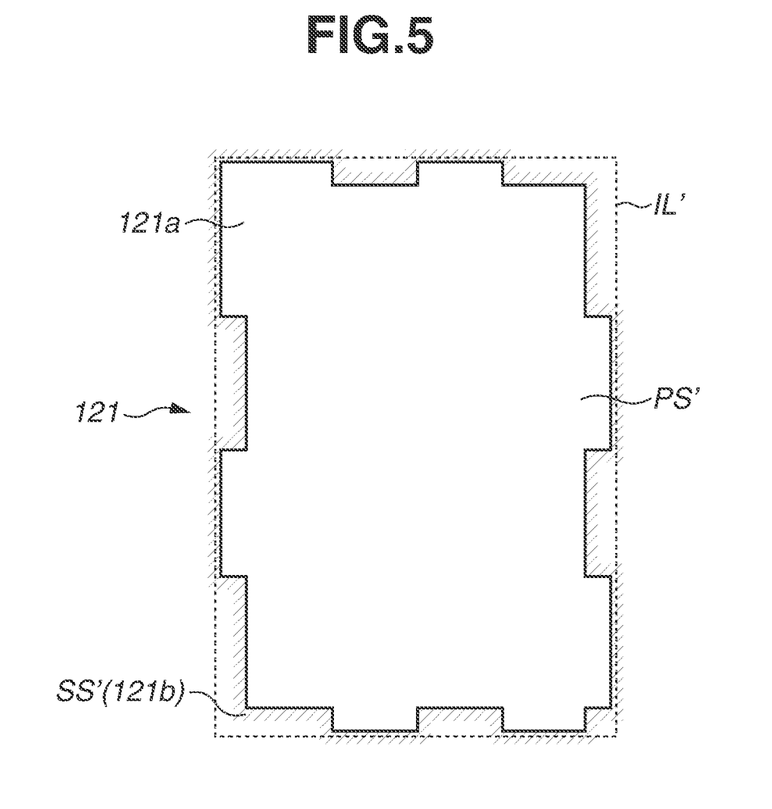
FIG. 5 is a diagram illustrating a relationship between a light-shielding surface and an irradiation region in a case where the present disclosure is not applied.

FIG. 5 illustrates a template to which the present exemplary embodiment is not applied, as a comparative example.

A template 121 of the comparative example has a main body 121*a* and a light-shielding member 121*b*. FIG. 5 illustrates the outer edge of each of a pattern surface PS' and a surface SS' (shaded area) of the light-shielding member 121*b*.

In FIG. 5, a region within an irradiation region IL' is to be irradiated with light. The irradiation region IL' has a rectangular shape corresponding to an opening of a light-shielding plate of a light-shielding mechanism.

As illustrated in FIG. 5, if the position of the light-shielding plate is aligned with a projected portion of a jigsaw shape, there is a case where a depressed portion is not appropriately shielded. In such a case, if an imprint material protrudes outward from the pattern surface PS' when the pattern surface PS' and the imprint material are brought into contact with each other, there is a possibility that the protruding imprint material is cured.

To shield the depressed portion appropriately, one idea may be to configure the light-shielding plate of an apparatus to have a complicated shape, or to use a digital mirror device (DMD) to control the region to be irradiated with curing light, but such an idea can lead to increases in cost and complexity of the apparatus.

In contrast, in the present exemplary embodiment illustrated in FIG. 4, the template 111 has the pattern surface PS whose outer edge has the jigsaw shape, and adhesion of the cured material to the side surface of the template 111 can be reduced.

Figure 6:
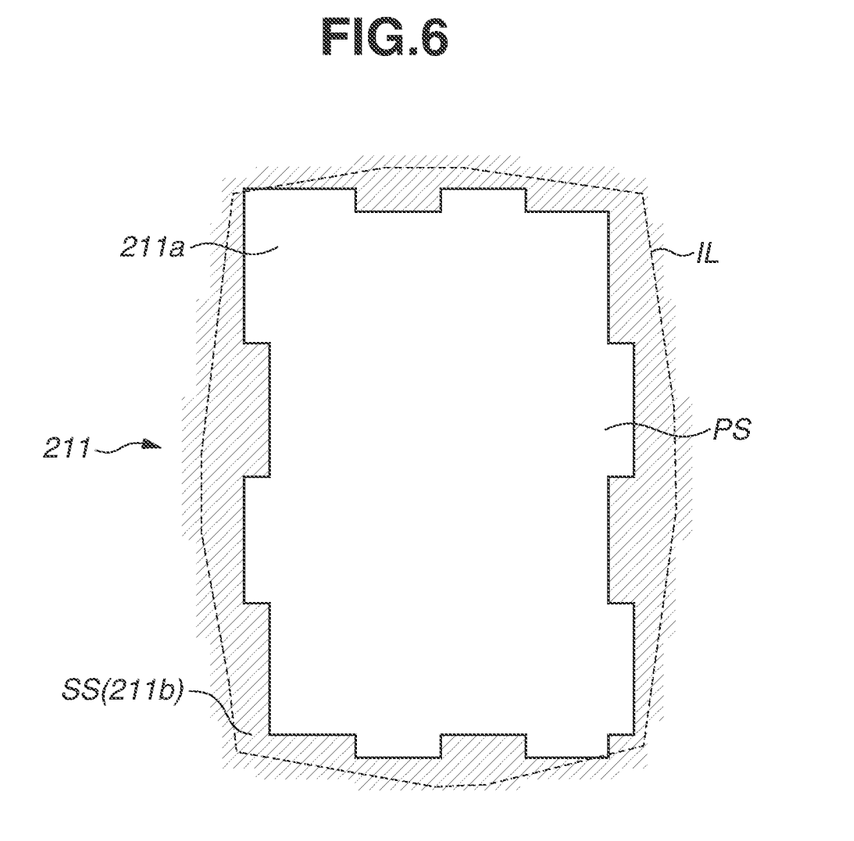
FIG. 6 is a diagram illustrating a modification.

FIG. 6 is a diagram illustrating a template 211 according to a modification. As described above, the imprint apparatus 100 includes the light-shielding mechanism 102 and the optical system 107. There is a case where the light shaped into a rectangle by the light-shielding mechanism 102 deforms relative to the rectangle by, for example, passing through the optical system 107.

In FIG. 6, the template 211, a main body 211*a*, and a light-shielding member 211*b* correspond to the template 111, the main body 111*a*, and the light-shielding member 111*b*, respectively, in FIG. 1 to FIG. 4. FIG. 6 illustrates a view (plan view) of the template 211 as viewed from above in a state similar to that in FIG. 3, and illustrates the outer edge of each of the pattern surface PS and a surface SS (shaded area) of the light-shielding member 211*b*.

In FIG. 6, a region within the irradiation region IL is to be irradiated with the light. The irradiation region IL has a rectangular shape corresponding to the opening of the light-shielding plate of the light-shielding mechanism 102. The outer edge of the surface SS of the light-shielding member 211*b* in the template 211 according to the modification has a shape corresponding to a shape of the irradiation region having each side that bulges outward at the center thereof.

The outer edge of the surface SS may have a multistage shape as illustrated in FIG. 6.

(Imprint Method)

Figure 7:
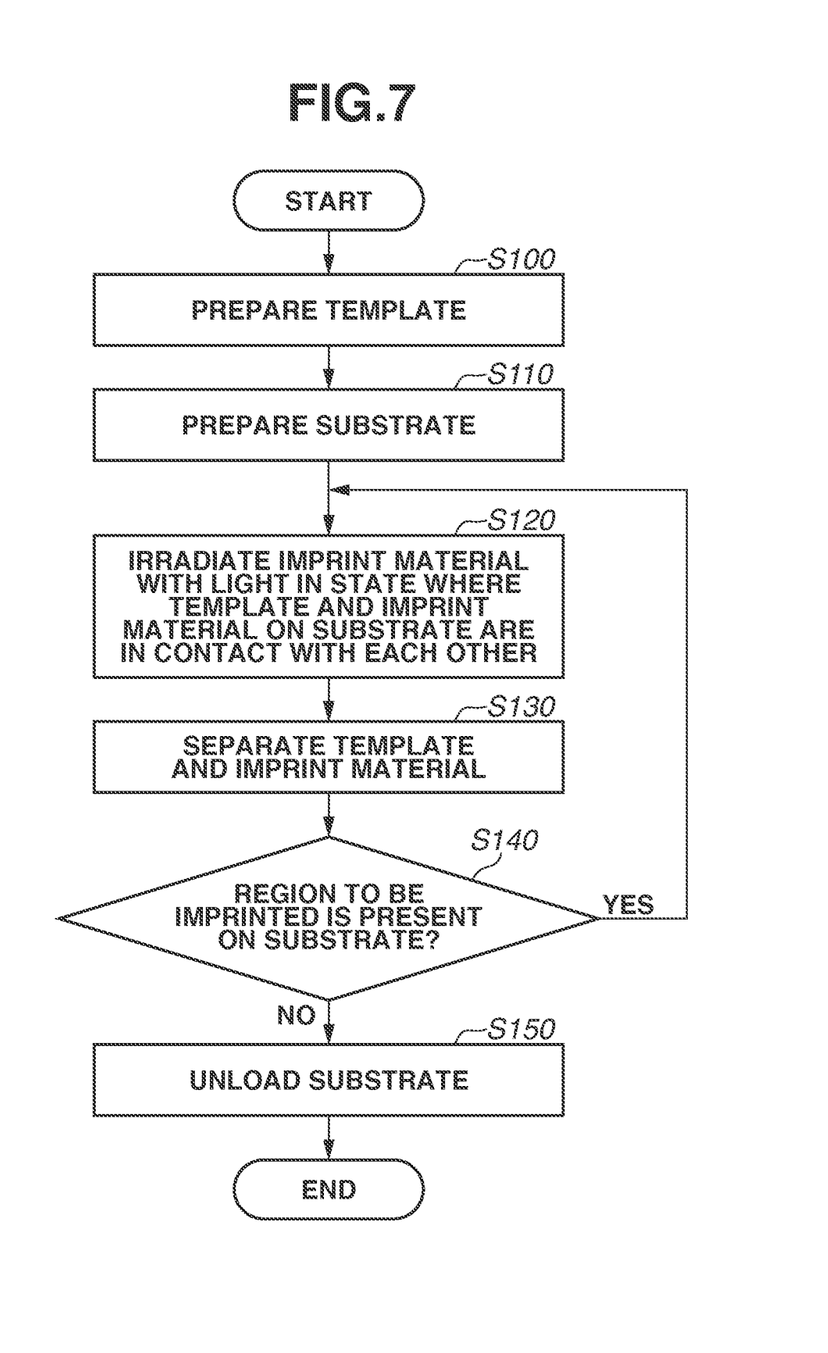
FIG. 7 is a diagram illustrating a flow of an imprint method using a template according to an exemplary embodiment of the present disclosure.

FIG. 7 is a diagram illustrating a flow of an imprint method using the template 111 described above. The imprint method according to the present exemplary embodiment forms a pattern in a plurality of shot regions of a substrate by repeating molding operation on the substrate using the template 111. For example, there may be about a hundred shot regions on a wafer of a semiconductor device. The reference numerals of the components according to the present exemplary embodiment will be used to describe the imprint method below, but the imprint method is also applicable to the modification.

First, in step S100, the template 111 is prepared (loaded). Subsequently, in step S110, the substrate 109 is prepared (loaded).

Next, in step S120, the imprint material 108 is irradiated with the light using the light source 101 in a state where the template 111 and the photocurable imprint material 108 on the substrate 109 are in contact with each other. After the irradiation, in step S130, the template 111 and the imprint material 108 on the substrate 109 are separated.

The molding operation includes step S120 and step S130. After the molding operation, in step S140, it is determined whether another region to be imprinted is present on the substrate 109. If such a region is present (YES in step S140), the molding operation (step S120 and step S130) is repeated, so that the pattern is formed in the plurality of shot regions of the substrate 109. If such a region is not present (NO in step S140), subsequently, in step S150, the substrate 109 is unloaded from the imprint apparatus 100.

As illustrated in FIG. 4, the outer shape of the irradiation region in the irradiation is a rectangular shape surrounding the outer edge of the pattern surface PS in a plan view as viewed from the pattern surface PS.

In the modification, as illustrated in FIG. 6, the irradiation region IL in the irradiation with the light has a shape encompassing a rectangular shape surrounding the outer edge of the pattern surface PS (a shape having each side that bulges outward at the center thereof relative to the rectangular shape surrounding the outer edge), in a plan view as viewed from the pattern surface PS.

In the present exemplary embodiment, the pattern surface PS of the template 111 corresponds to the size of one shot region on the substrate 109, but is not limited thereto. For example, a template having a plurality of (e.g., two to four) pattern surfaces corresponding to the size of one shot region may be adopted.

(Example of Device Manufacturing Method)

A device (such as a semiconductor device, a magnetic storage medium, a liquid crystal display, or a diffraction grating) manufacturing method will be described. The manufacturing method includes transferring a pattern of a template to a surface of a substrate (such as a wafer, a glass plate, or a film-shaped substrate) using an imprint apparatus. The manufacturing method further includes processing the substrate on which the pattern is formed. The processing includes etching the substrate by using the pattern as a mask. The manufacturing method further includes adding an electrical property to the etched substrate, extracting a chip by dicing the substrate to which the electrical property has been added, and packaging the extracted chip.

The device manufacturing method according to the present exemplary embodiment is advantageous in at least one of the performance, quality, productivity, and production cost of the device, in comparison with a conventional method.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-220762, filed Dec. 5, 2019, which is hereby incorporated by reference herein in its entirety.

What is claimed is:

1. A template for imprinting, the template comprising:
a main body having a bottom surface, a middle surface on a portion protruding relative to the bottom surface, and a pattern surface on a portion protruding relative to the middle surface, the pattern surface having an uneven pattern,
wherein an outer edge of the pattern surface has a jigsaw shape,
wherein a light-shielding member having a light transmittance lower than a light transmittance of the main body is disposed on the middle surface to surround the outer edge of the pattern surface in a plan view as viewed from the pattern surface, and
wherein an outer edge of light-shielding member defines four sides having a shape in which a center of each side bulges outward with respect to a rectangle surrounding the outer edge of the pattern surface in the plan view, and wherein the shape of each side bulges outwardly in a stepwise manner from the ends of each side to the center of each side.

2. The template according to claim 1, wherein the main body has a held surface opposite to the bottom surface.

3. The template according to claim 1, wherein a surface of the light-shielding member is at a height between the pattern surface and the middle surface.

4. An imprint method of forming a pattern in a plurality of shot regions of a substrate by repeating a molding operation on the substrate using a template, the imprint method comprising:
preparing the template;
preparing the substrate; and
irradiating a photocurable imprint material on the substrate with light in a state where the template and the imprint material are in contact with each other,
wherein the template includes a main body having a bottom surface, a middle surface on a portion protruding relative to the bottom surface, and a pattern surface on a portion protruding relative to the middle surface, the pattern surface having an uneven pattern,
wherein an outer edge of the pattern surface has a jigsaw shape,
wherein a light-shielding member having a light transmittance lower than a light transmittance of the main body is disposed on the middle surface to surround the outer edge of the pattern surface in a plan view as viewed from the pattern surface,
wherein an outer edge of light-shielding member defines four sides having a shape in which a center of each side bulges outward with respect to a rectangle surrounding the outer edge of the pattern surface in the plan view, and wherein the shape of each side bulges outwardly in a stepwise manner from the ends of each side to the center of each side, and wherein an irradiation region in the irradiating with the light defines the rectangle surrounding the outer edge of the pattern surface in the plan view.

\* \* \* \* \*